United States Patent
Arimatsu

(10) Patent No.: US 8,957,570 B2
(45) Date of Patent: Feb. 17, 2015

(54) PIEZOELECTRIC VIBRATOR, OSCILLATOR, ELECTRONIC INSTRUMENT, AND RADIO TIMEPIECE

(71) Applicant: Seiko Instruments Inc., Chiba (JP)

(72) Inventor: Daishi Arimatsu, Chiba (JP)

(73) Assignee: Sii Crystal Technology Inc., Chiba (JP)

( * ) Notice: Subject to any disclaimer, the term of this patent is extended or adjusted under 35 U.S.C. 154(b) by 347 days.

(21) Appl. No.: 13/630,716

(22) Filed: Sep. 28, 2012

(65) Prior Publication Data

US 2013/0082574 A1   Apr. 4, 2013

(30) Foreign Application Priority Data

Sep. 29, 2011   (JP) ................. 2011-215148

(51) Int. Cl.
*H03H 9/21* (2006.01)
*G04R 20/00* (2013.01)
*G04R 20/10* (2013.01)
*H03H 9/10* (2006.01)

(52) U.S. Cl.
CPC .............. *G04R 20/00* (2013.01); *G04R 20/10* (2013.01); *H03H 9/1021* (2013.01)
USPC ........................................ 310/370

(58) Field of Classification Search
CPC ... H03H 9/02; H03H 9/215; H03H 2003/026; H03H 9/2468; B06B 1/0659; G01C 19/56
USPC ............................ 310/370; 331/156; 333/200
See application file for complete search history.

(56) References Cited

U.S. PATENT DOCUMENTS 5,345,822 A * 9/1994 Nakamura et al. .......... 73/504.14
6,242,848 B1 * 6/2001 Mori et al. .................... 310/326
8,558,435 B2 * 10/2013 Murata et al. ................ 310/370

FOREIGN PATENT DOCUMENTS

JP           05083073 A  *  4/1993
JP           2002-009576      1/2002

* cited by examiner

*Primary Examiner* — J. San Martin
(74) *Attorney, Agent, or Firm* — Brinks Gilson & Lione

(57) ABSTRACT

There is provided a piezoelectric vibrator including a piezoelectric vibration reed having a pair of vibrating arm portions and a base portion configured to integrally fix proximal end sides of the pair of vibrating arm portions, a base substrate on which the piezoelectric vibration reed is mounted, and a lid substrate joined to the base substrate and configured to accommodate the piezoelectric vibration reed in a cavity defined between the lid substrate and the base substrate, wherein the base substrate is formed with a first engaging portion, and a second engaging portion configured to engage the first engaging portion and guide the piezoelectric vibration reed to a predetermined mount position of the base substrate and position the same is formed on the base portion of the piezoelectric vibration reed.

17 Claims, 13 Drawing Sheets

US 8,957,570 B2

PIEZOELECTRIC VIBRATOR, OSCILLATOR, ELECTRONIC INSTRUMENT, AND RADIO TIMEPIECE

RELATED APPLICATIONS

This application claims priority under 35 U.S.C. §119 to Japanese Patent Application No. 2011-215148 filed on Sep. 29, 2011, the entire content of which is hereby incorporated by reference.

BACKGROUND OF THE INVENTION

1. Technical Field

The present invention relates to a piezoelectric vibrator, an oscillator, an electronic instrument, and a radio timepiece.

2. Description of the Related Art

In mobile phones or portable information terminal equipment, a piezoelectric vibrator using crystal or the like is employed as a time-of-day source, a timing source of a control signal, a reference signal source or the like. Various types of the piezoelectric vibrators of this type are provided, and as one of these piezoelectric vibrators, a piezoelectric vibrator having so-called a tuning-fork type piezoelectric vibration reed is known.

The tuning-fork type vibration reed includes a pair of vibration arm portions disposed in parallel and a base portion supporting proximal portions of the pair of vibrating arm portions. Then, an electrode film is formed on a surface of the piezoelectric vibration reed, and when a voltage is applied to the electrode film, the pair of vibrating arm portions can be brought into vibrations at a predetermined resonant frequency in the directions toward and away from each other.

As a piezoelectric vibrator having the vibration reed as described above, a surface-mounted type in which the piezoelectric vibration reed is accommodated in a cavity formed in the interior of a package composed of a base substrate and a lid substrate joined to each other is known.

The piezoelectric vibrator of this type has a configuration in which a vibration reed 5 is mounted on a base substrate 1 as shown in FIG. 15, and the lid substrate, not illustrated, is joined to the base substrate 1, so that the mounted vibration reed 5 is accommodated in the cavity.

Incidentally, the vibration reed 5 is mounted at a predetermined position with respect to the base substrate 1, and is mechanically supported by the mount and simultaneously electricity is conducted to an electrode on the side of the base substrate 1.

Detailed description about this point will be given below.

As shown in FIG. 15, the base substrate 1 includes a pair of through electrodes 2A and 2B and a pair of drawing electrodes 3A and 3B penetrated through the interior and the exterior of the package. The respective drawing electrodes 3A and 3B are connected to the through electrodes 2A and 2B and a mount electrode, not illustrated, formed on a base portion 6 of the vibration reed 5.

The mount electrode of the vibration reed 5 and the drawing electrodes 3A and 3B are bonded by a bonding material 8 such as a conductive adhesive agent or a bump (Au or the like) while securing the conductivity (for example, see JP-A-2002-9576).

Normally, when manufacturing the piezoelectric vibrator, after the bonding material 8 is applied at a predetermined position on the base substrate 1, the vibration reed 5, which is held by a robot or the like, is positioned at the predetermined position where the bonding material 8 is applied so as to be aligned with the mount electrode. Then, the vibration reed 5 is moved toward the base substrate 1 and the mount electrode is pressed against the bonding material 8, whereby the vibration reed 5 is bonded to the base substrate 1.

When the bump is used as the bonding material 8, the bump is heated and melted in advance when moving the vibration reed 5 toward the base substrate 1. Then, by hardening the melted bump after having pressed the vibration reed 5 against the bump in this state, the vibration reed 5 is mounted.

However, when the vibration reed 5 is mounted on the base substrate 1, the vibration reed 5 may be mounted in an inclined state, and may be deviated from an original mount position. In particular, as shown in FIG. 15, there is a case where the vibration reed 5 is inclined in the direction rotating in a plane along the surface of the base substrate 1 (the direction indicated by an arrow in the drawing). In this case, part of the vibration reed 5 may come into contact with the inner wall of the package, and vibration characteristic is significantly impaired.

Even when the vibration reed 5 is mounted while controlling the position of the vibration reed 5 by a robot or the like, since the positional accuracy on the order of several tens of µm is required, it is difficult to control by a machine.

In particular, when the bump is used as the bonding material 8, even when the vibration reed 5 is positioned with high degree of accuracy using the robot or the like by way of experiment, since the bump in a state of not being hardened is soft, the vibration reed 5 may be displaced by being slipped or the like on the bump at the moment when the vibration reed 5 is released from being held by the robot or the like. Therefore, the above-described problem may occur.

When the conductive adhesive agent is used as the bonding material 8, even when the vibration reed 5 is positioned with high degree of accuracy by way of experiment, since the conductive adhesive agent is susceptible to plastic deformation, the vibration reed 5 may be displaced in position due to external impact or the like, and hence the above-described problem may occur in this case as well.

From the reasons described above, it is necessary to inspect whether the vibration reed 5 is displaced or not in an actual manufacturing process, which results in increase in labor and cost. Since the piezoelectric vibrators having the vibration reed 5 whose amount of displacement is deviated from a predetermined tolerance are excluded as rejects, unprofitable material cost is resulted here as well.

Accordingly, it is an object of the invention to provide a piezoelectric vibrator having a piezoelectric vibration reed inhibited from positional displacement and mounted at a desired position and is capable of demonstrating desirable vibrating characteristics, an oscillator, an electronic instrument, and a radio timepiece having such a piezoelectric vibrator.

SUMMARY OF THE INVENTION

In order to solve the problems as described above, the invention employs following means.

According to a first aspect of the invention, there is provided a piezoelectric vibrator including: a piezoelectric vibration reed including a pair of vibrating arm portions arranged in parallel to each other, and a base portion configured to integrally fix proximal end sides in the longitudinal direction of the pair of vibrating arm portions; a base substrate on which the piezoelectric vibration reed is to be mounted; and a lid substrate joined so as to oppose the base substrate and configured to accommodate the piezoelectric vibration reed in a cavity defined between the lid substrate and the base substrate, wherein the base substrate is formed with a first engaging portion, and the base portion of the piezoelectric vibration reed is formed with a second engaging portion configured to engage the first engaging portion and guide the piezoelectric vibration reed to a predetermined mount position on the base substrate and position the same.

According to the invention, when mounting the piezoelectric vibration reed on the base substrate, the first engaging portion and the second engaging portion are engaged, so that the piezoelectric vibration reed is guided to and positioned at the predetermined mount position on the base substrate. Accordingly, positional displacement of the piezoelectric vibration reed is prevented, and hence the piezoelectric vibration reed may be mounted easily at the predetermined position accurately.

Therefore, the piezoelectric vibration reed is prevented from losing its vibration characteristics due to interference with the base substrate or the lid substrate. Also, since the first engaging portion and the second engaging portion engage with respect to each other, the positional displacement of the piezoelectric vibration reed is not likely to occur even by the external impact or the like. In this point as well, stable and desirable vibration characteristics may be easily demonstrated.

Preferably, in the piezoelectric vibrator according to the invention, the first engaging portion is a projecting portion projecting from a surface of the base substrate, and the second engaging portion is a depression or a through hole formed on the base portion of the piezoelectric vibration reed.

In this case, by fitting the projecting portion as the first engaging portion into the depression or the through hole as the second engaging portion, the positional displacement of the piezoelectric vibration reed is effectively prevented.

Preferably, in the piezoelectric vibrator according to the invention, a plurality of sets of the first engaging portions and the second engaging portions are formed.

In this case, since a plurality of the first engaging portions are formed on the base substrate side and a plurality of the second engaging portions are formed on the side of the piezoelectric vibration reed corresponding to the first engaging portion, the positional displacement of the piezoelectric vibration reed is further effectively prevented.

Preferably, in the piezoelectric vibrator according to the invention, the first engaging portion is in conduction with an external electrode formed on the base substrate for distributing electricity to the piezoelectric vibration reed, the second engaging portion is in conduction with a mount electrode formed on the base substrate of the piezoelectric vibration reed, and the external electrode and the mount electrode are in conduction with each other by the engagement between the first engaging portion and the second engaging portion.

In this case, the first engaging portion and the second engaging portion may be also functioned as electrodes, the electric conductivity between the external electrode and the mount electrode may be further stabilized. Therefore, the pair of vibrating arm portions may be vibrated stably, hence the reliability of the operation may be improved.

According to a second aspect of the invention, there is provided an oscillator wherein the piezoelectric vibrator according to the invention is electrically connected to an integrated circuit as an oscillating element.

According to a third aspect of the invention, there is provided an electronic instrument wherein the piezoelectric vibrator of the invention is electrically connected to a clocking unit.

According to a fourth aspect of the invention, there is provided a radio timepiece wherein the piezoelectric vibrator of the invention is electrically connected to a filter portion.

In this configuration, since the piezoelectric vibrator of the invention which demonstrates desirable vibration characteristics is provided, the oscillator, the electronic instrument, and the radio timepiece having high reliability and a high performance is provided.

According to the invention, a piezoelectric vibrator having a piezoelectric vibration reed inhibited from positional displacement, mounted at a desired position and is capable of demonstrating desirable vibrating characteristics is provided. Also, a rejection ratio due to the positional displacement of the piezoelectric vibration reed is inhibited and hence the inspection may be simplified or eliminated, whereby the piezoelectric vibrator described above may be manufactured at low costs without waste.

DESCRIPTION OF THE PREFERRED EMBODIMENTS

Figure 1:
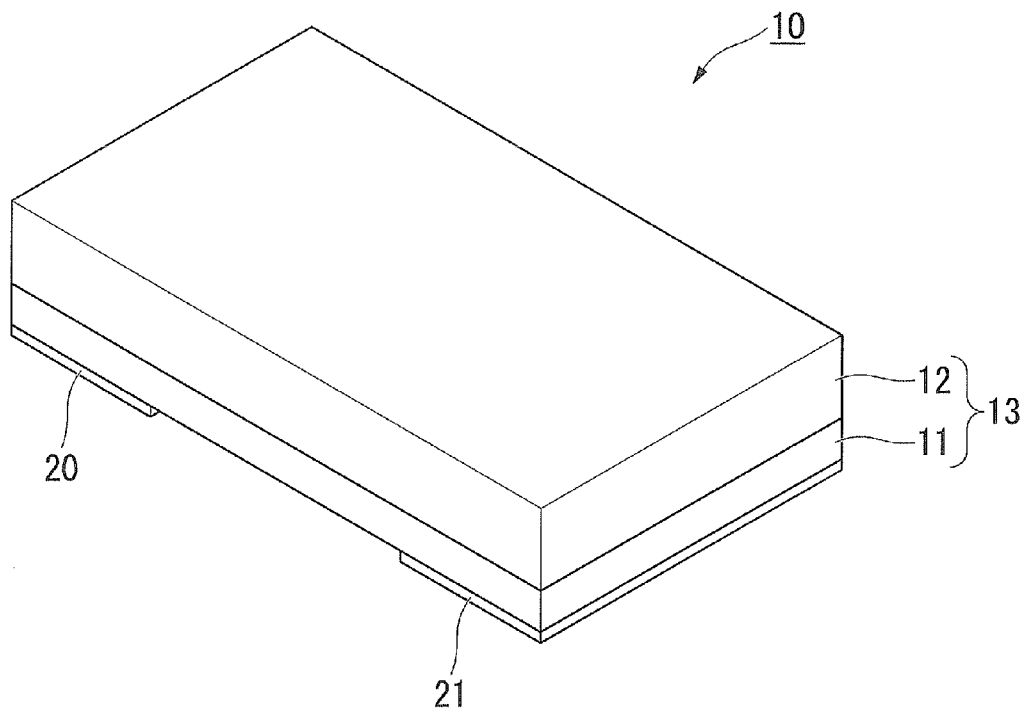
FIG. 1 is an appearance perspective view showing an embodiment of a piezoelectric vibrator according to the invention.

Referring now to the drawings, best modes for implementing a piezoelectric vibrator, an oscillator, an electronic instrument, and a radio timepiece according to the invention will be described below. However, the invention is not limited to these embodiments.

Configuration of Piezoelectric Vibrator

As shown in FIG. 1 to FIG. 5, a piezoelectric vibrator 10 of this embodiment is a surface-mounted vibrator including a box-shaped package 13 in which a base substrate 11 and a lid substrate 12 are joined by, for example, anode wafer bonding or joined via a joint film or the like, not shown, and a piezoelectric vibration reed 30 accommodated in a cavity C formed in the interior of the package 13 and mounted on the base substrate 11.

Figure 2:
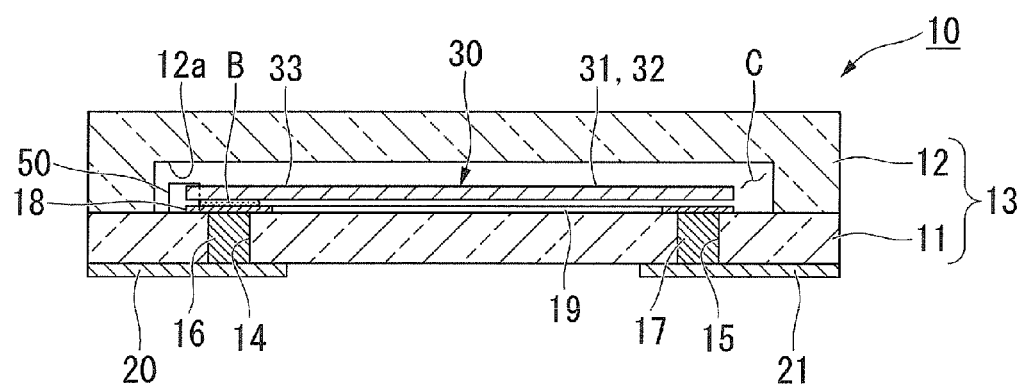
FIG. 2 is a cross-sectional view of the piezoelectric vibrator taken along the line A-A in FIG. 4.

As shown in FIG. 1 and FIG. 2, the base substrate 11 and the lid substrate 12 are transparent insulative substrates formed of a glass material, for example, a soda-lime glass, and is formed into a substantially plate shape. The lid substrate 12 is formed with a rectangular depression 12a for accommodating the piezoelectric vibration reed 30 on the side of a joint surface where the base substrate 11 is joined. The depression 12a functions as a depression which defines the cavity C for accommodating the piezoelectric vibration reed 30 when the base substrate 11 and the lid substrate 12 are stacked so as to oppose each other one on top of another.

As shown in FIG. 2, the base substrate 11 is formed with a pair of through holes 14 and 15 configured to penetrate the base substrate 11 in the thickness direction. The through holes 14 and 15 are formed at positions accommodated within the cavity C. More specifically, the through holes 14 and 15 of this embodiment are such that the through hole 14 is formed at a position corresponding to a base portion 33 side, described later, of the piezoelectric vibration reed 30 mounted thereon and the through hole 15 is formed at a position corresponding to the sides of vibrating arm portions 31 and 32, described later.

Then, a pair of through electrodes 16 and 17 are formed in the pair of through holes 14 and 15 so as to be embedded therein. The through electrodes 16 and 17 are conductive core members fixed integrally with the through holes 14 and 15, for example, and are formed so as to be flat at both ends thereof and have the substantially same thickness as the thickness of the base substrate 11. Accordingly, the electric conductivity is secured on both surfaces of the base substrate 11 while maintaining air-tightness in the cavity C.

The through electrodes 16 and 17 are not limited to the case described above, and may be formed, for example, by inserting metal pins, not shown, in the through holes 14 and 15, then filling glass frit between the through holes 14 and 15 and the metal pins and sintering the same. Furthermore, a conductive adhesive agent embedded in the through holes 14 and 15 is also applicable.

Figure 3:
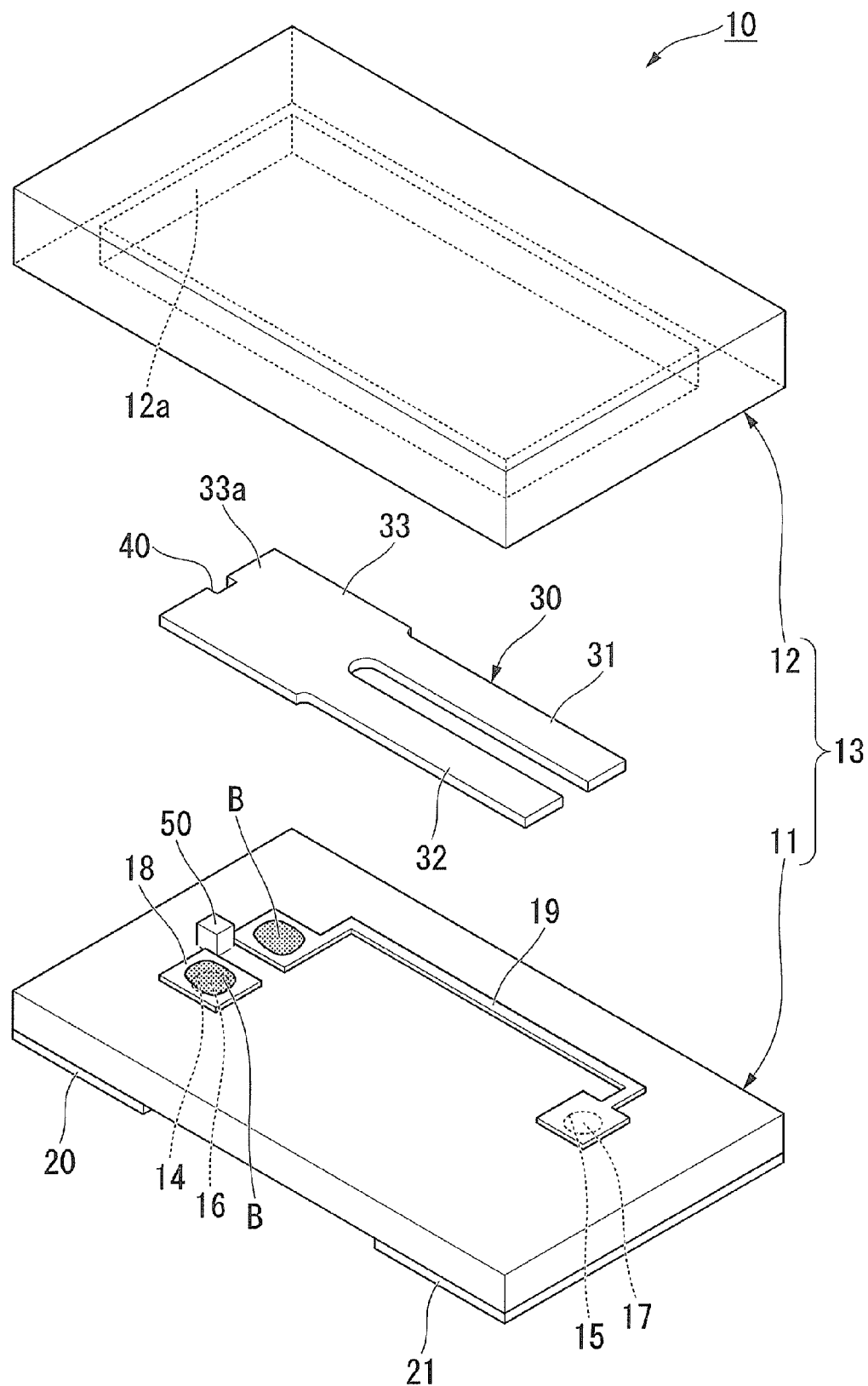
FIG. 3 is an exploded perspective view of the piezoelectric vibrator shown in FIG. 1.
Figure 4:
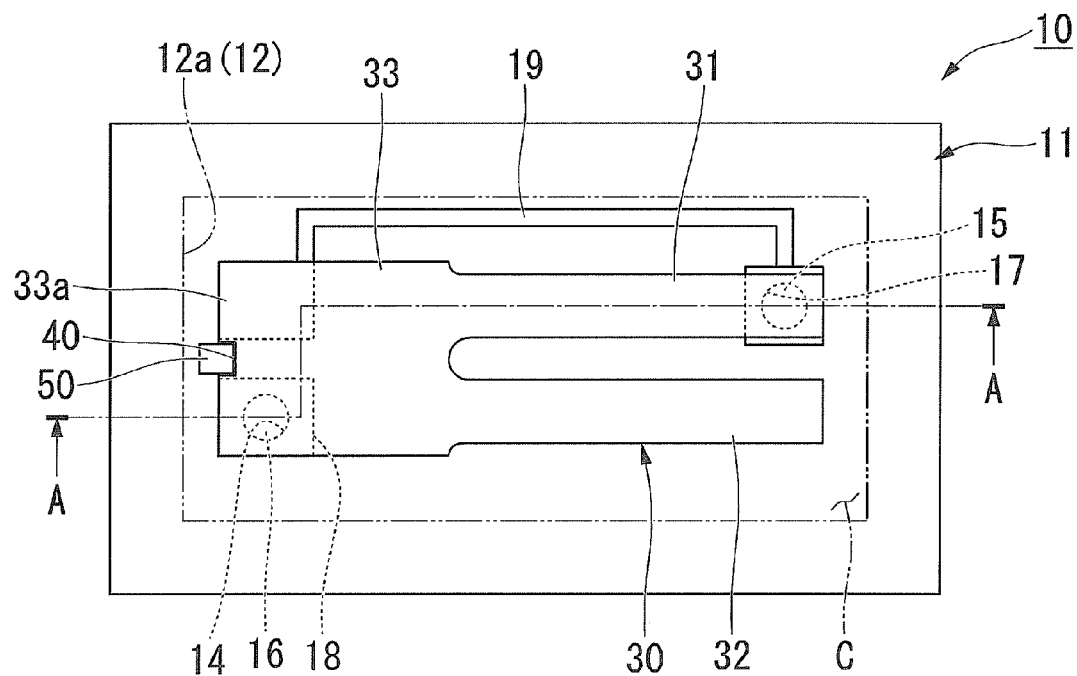
FIG. 4 is an internal configuration drawing of the piezoelectric vibrator shown in FIG. 1 illustrating the piezoelectric vibration reed viewed from above in a state in which a lid substrate is removed.

As shown in FIG. 3 and FIG. 4, a pair of drawing electrodes 18 and 19 are patterned on an upper surface side (the side of a joint surface to which the lid substrate 12 is joined) of the base substrate 11. The drawing electrode 18, which is one of the pair of drawing electrodes 18 and 19, is formed so as to cover the through electrode 16. The other drawing electrode 19 covers the through electrode 17 at one end side, and extends on the other end side in the longitudinal direction of the base substrate 11 and is arranged at a position adjacent to the drawing electrode 18.

Figure 5:
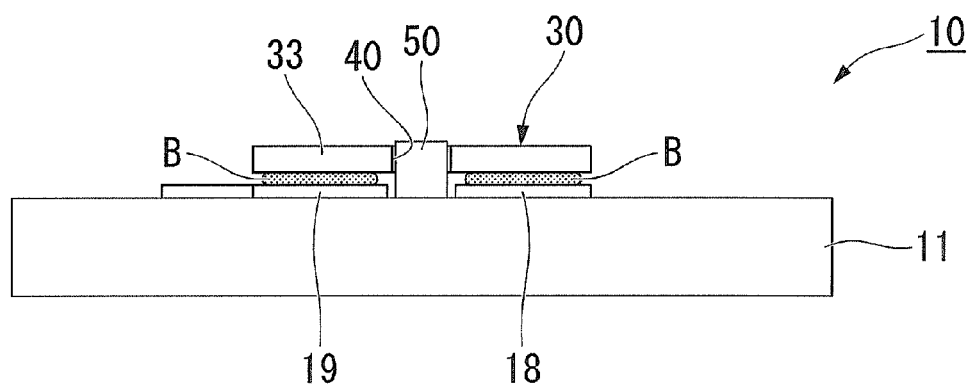
FIG. 5 is a left side view of FIG. 4.

As shown in FIG. 3 and FIG. 5, bumps B formed of gold or the like, respectively, are formed on upper surfaces of the pair of drawing electrodes 18 and 19.

As shown in FIG. 1 to FIG. 3, external electrodes 20 and 21 to be electrically connected respectively to the pair of through electrodes 16 and 17 are formed on a lower surface of the base substrate 11.

Piezoelectric Vibration Reed

As shown in FIG. 3 and FIG. 4, the piezoelectric vibration reed 30 is a tuning-fork type vibration reed formed of a piezoelectric material such as crystal, lithium tantalate, or lithium niobate, and includes a pair of the vibrating arm portions 31 and 32 arranged so as to extend in parallel to each other and the plate-shaped base portion 33 configured to integrally fix proximal end sides of the pair of vibrating arm portions 31 and 32.

The pair of vibrating arm portions 31 and 32 are formed with exciting electrodes, not shown, configured to vibrate the pair of vibrating arm portions 31 and 32 on outer surfaces thereof. The base portion 33 is formed with mount electrodes, not shown, on an outer surface thereof, and the mount electrodes are electrically connected to the excitation electrodes by a drawing electrode, not shown.

The piezoelectric vibration reed 30 is mounted in a state in which the mount electrode is in contact with the bumps B formed on the drawing electrodes 18 and 19 described above. Accordingly, the piezoelectric vibration reed 30 is supported in a state of coming off an upper surface of the base substrate 11, and is in a state of electrically connected to the respective drawing electrodes 18 and 19.

Incidentally, the piezoelectric vibration reed 30 of this embodiment is formed with an engaging depression (second engaging portion, depression) 40 at a widthwise center portion of an end portion 33a of the base portion 33 opposite to the side where the vibrating arm portions 31 and 32 are formed. In the illustrated example, the engaging depression 40 is notched depression formed over the direction of thickness of the piezoelectric vibration reed 30.

In contrast, the base substrate 11 is formed with an engaging projection (first engaging portion, projecting portion) 50 at positions opposing the engaging depression 40 in a state in which the piezoelectric vibration reed 30 is positioned at a predetermined mount position with respect to the base substrate 11. The engaging projection 50 is a projecting portion having an outer diameter which can be fitted into the engaging depression 40, and may be formed on the base substrate 11, for example, by spattering or the like, or may be formed by providing pins or the like so as to extend upright therefrom.

Then, by the engaging projection 50 of the base substrate 11 fitted into and mutually engaged with the engaging depression 40 of the piezoelectric vibration reed 30, the piezoelectric vibration reed 30 is mounted on the base substrate 11 in a state of being positioned at a desired mount position.

Operation of Piezoelectric Vibrator

When activating the piezoelectric vibrator 10 configured in this manner, a predetermined drive voltage is applied to the external electrodes 20 and 21 formed on the base substrate 11. Accordingly, a current is allowed to pass through the excitation electrode of the piezoelectric vibration reed 30, so that the pair of vibrating arm portions 31 and 32 may be vibrated in the direction toward and away from each other (width direction) at a predetermined resonant frequency. Then, the piezoelectric vibrator 10 may be used as a time-of-day source, a timing source of a control signal, a reference signal source or the like using the vibrations of the pair of vibrating arm portions 31 and 32.

Method of Assembling Piezoelectric Vibrator

Subsequently, a method of manufacturing the above-described piezoelectric vibrator 10 will be described in brief.

First of all, the piezoelectric vibration reed 30 is held by, for example, a robot or the like, and is positioned at a predetermined mount position on the base substrate 11. In this case, the engaging depression 40 of the piezoelectric vibration reed 30 is fitted to the engaging projection 50 of the base substrate 11, and is engaged with each other. Accordingly, the piezoelectric vibration reed 30 is guided to a predetermined mount position on the predetermined base substrate 11, and the piezoelectric vibration reed 30 is inhibited from being displaced from the mount position.

Then, from this state, the piezoelectric vibration reed 30 is pressed toward the base substrate 11 to press the mount electrode of the piezoelectric vibration reed 30 against the bumps B heated and melted in advance. Then, the bumps B are cooled and hardened, and the piezoelectric vibration reed 30 is fixed to the base substrate 11. In this case, as shown in FIG. 3 and FIG. 4, since the engaging projection 50 of the base substrate 11 is fitted into the engaging depression 40, even when the piezoelectric vibration reed 30 is released from the state of being held, for example, by the robot, the piezoelectric vibration reed 30 is not likely to be displaced from the desired mount position unlike the related art.

Then, finally, the base substrate 11 and the lid substrate 12 are joined by, for example, anodic wafer bonding, and the piezoelectric vibration reed 30 is accommodated in the cavity C formed between the both substrates 11 and 12, so that the assembly of the piezoelectric vibrator 10 is completed.

Effect of Embodiment

According to the piezoelectric vibrator 10 of this embodiment, the engaging depression 40 is formed on the piezoelectric vibration reed 30 and the engaging depression 40 is fitted onto the engaging projection 50 provided on the base substrate 11, so that the engaging depression 40 and the engaging projection engage with respect to each other. Accordingly, the piezoelectric vibration reed 30 is guided to and positioned at the predetermined mount position on the base substrate 11 and the piezoelectric vibration reed 30 is prevented from being displaced within a plane parallel to the upper surface of the base substrate 11.

Therefore, the vibration characteristics of the piezoelectric vibration reed 30 is prevented from being impaired by the interference with the inner wall or the like of the package 13. Also, since the engaging depression 40 and the engaging projection 50 engage with respect to each other, the positional displacement of the piezoelectric vibration reed 30 is not likely to occur even when the external impact is applied. In this point as well, stable and desirable vibration characteristics may be easily demonstrated.

In addition, a rejection ratio due to the positional displacement of the piezoelectric vibration reed 30 is inhibited and hence the inspection may be simplified or eliminated. Consequently, the piezoelectric vibrator 10 having desirable vibration characteristics may be manufactured at low costs without waste.

Modifications of the embodiment described above will be shown below. In the following description, a configuration different from the embodiment described above will be mainly described, and the configuration common to the embodiment described above is designated by the same reference numerals in the drawings and description will be omitted.

First Modification of Embodiment

In the embodiment described above, only one set of the engaging depression 40 and the engaging projection 50 is provided. However, the invention is not limited thereto, and a plurality of sets of the engaging depressions 40 and the engaging projections 50 may be provided.

Figure 6:
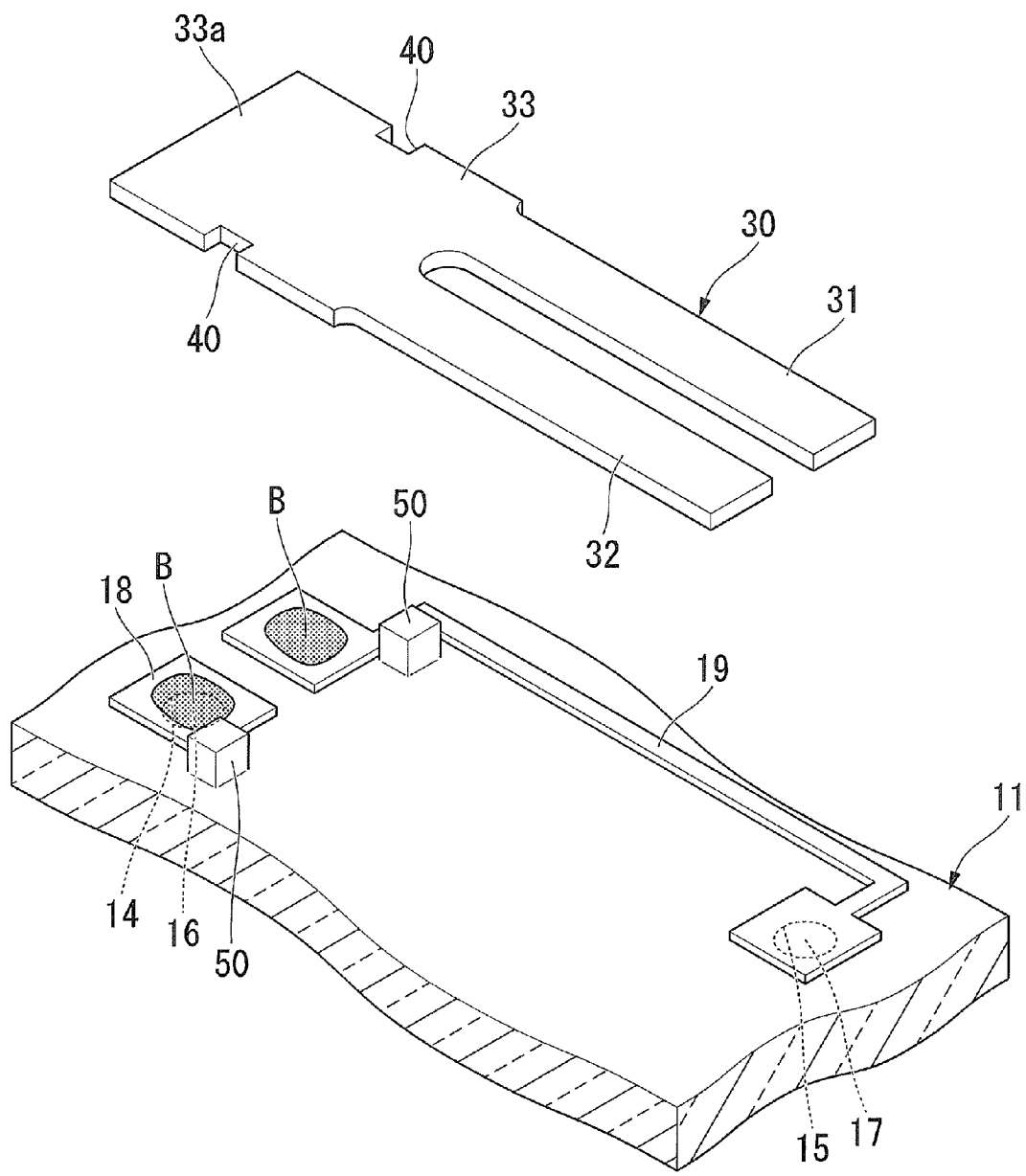
FIG. 6 is a drawing of a first modification of the piezoelectric vibrator showing an example in which a plurality of engaging depressions and engaging projections are provided.

For example, as shown in FIG. 6, one each, that is, two in total of the engaging depressions 40 may be formed on both side portions of the base portion 33 of the piezoelectric vibration reed 30 so that the engaging projections 50 may be formed at positions fitted to the respective engaging depressions 40.

In this configuration, positioning and fixation of the piezoelectric vibration reed 30 is further ensured. In particular, in this case, since the engaging depressions 40 are opened respectively outward in the width direction, and are penetrated through the direction of the thickness of the base portion 33, the engaging depressions 40 may be functioned as notched portions (notches) on the base portion 33. With the engaging depressions 40 functioned as the notches, the shape of the base portion 33 may be formed into a constricted shape, which is a narrow portion having a smaller width than other portions.

With the narrower portion formed by the engaging depressions 40, a route through which the vibrations excited by the vibrating arm portions 31 and 32 are transmitted to the base portion 33 side can be narrowed, so that the vibrations are locked on the side of the vibrating arm portions 31 and 32 and are easily inhibited from leaking toward the base portion 33 side. Accordingly, a vibration leak is effectively restrained, and a CI value is inhibited from increasing, whereby the deterioration of the quality of an output signal may be inhibited.

Second Modification of Embodiment

Figure 7:
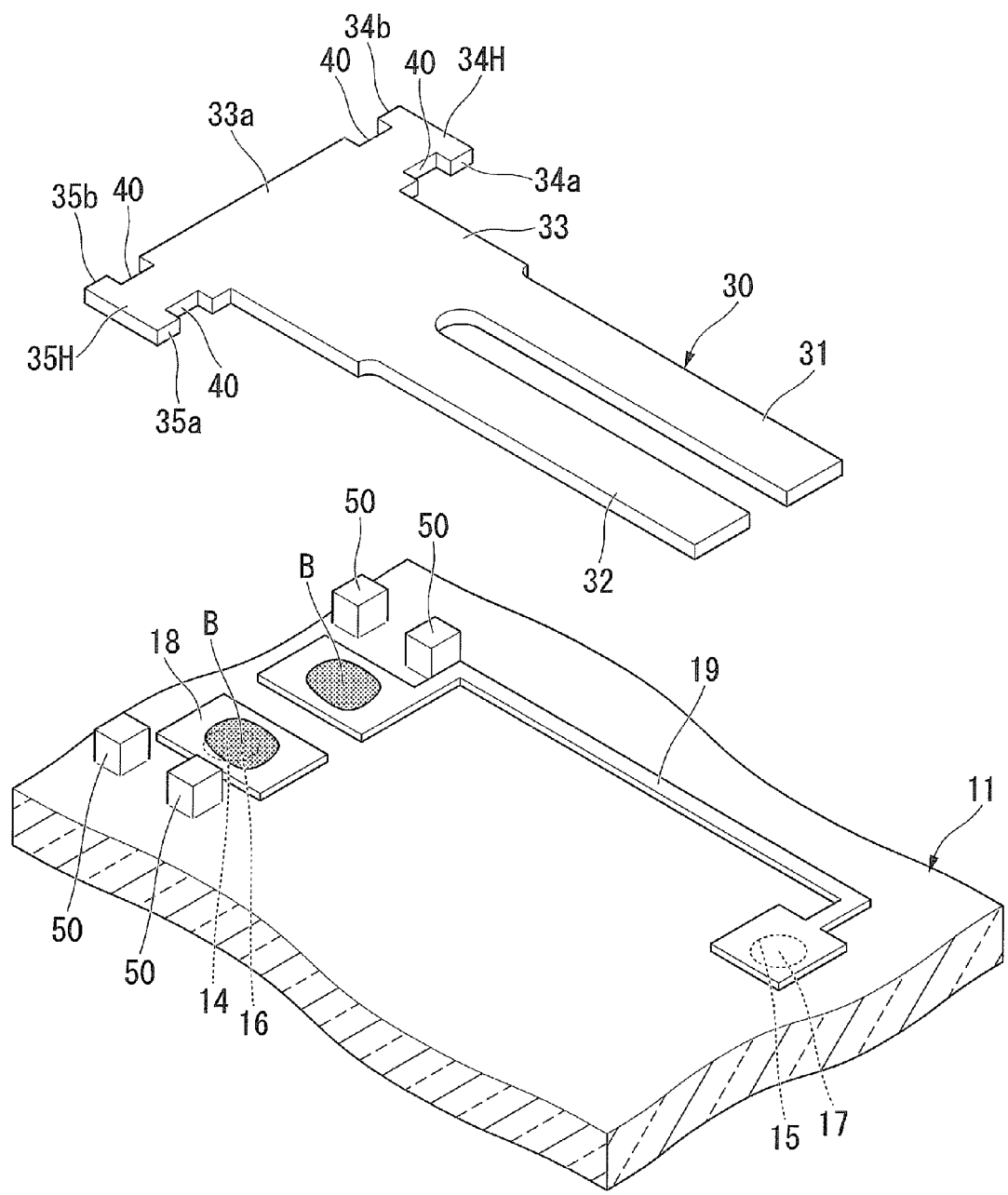
FIG. 7 is a drawing of a second modification of the piezoelectric vibrator showing an example in which projecting portions projecting sideward are provided on a base portion and engaging depressions are formed on the projecting portions.

FIG. 7 is a drawing of a second modification of the piezoelectric vibrator showing an example in which projecting portions projecting sideward are provided on the base portion and engaging depressions are formed on the projecting portions.

As shown in FIG. 7, the base portion 33 is formed with projecting portions 34H and 35H projecting sideward in both directions at the end portion 33a opposite to the vibrating arm portions 31 and 32. Then, in the projecting portions 34H and 35H, the engaging depressions 40 described above are formed on side surfaces 34a and 35a on the side of the vibrating arm portions 31 and 32 and on side surfaces 34b and 35b on the opposite side thereof respectively, and the engaging projections 50 are formed at positions fitted into the respective engaging depressions 40.

In this configuration as well, positioning and fixation of the piezoelectric vibration reed 30 is further ensured.

With the provision of the projecting portions 34H and 35H formed on the base portion 33, vibrations at the base portion 33 are reliably absorbed, so that leak of the vibrations to the outside can easily be prevented. When the vibrations are not attenuated sufficiently at the base portion 33 and leaks toward the package 13 side through the mount portion, a resonant frequency F is shifted. However, with the formation of the projecting portions 34H and 35H on the base portion 33, the resonant frequency F is prevented from being shifted and hence the loss at the time of conversion from an electrical signal to mechanic vibrations is inhibited, so that the quality of product can easily be prevented from lowering due to an increase of the CI value.

Third Modification of Embodiment

Figure 8:
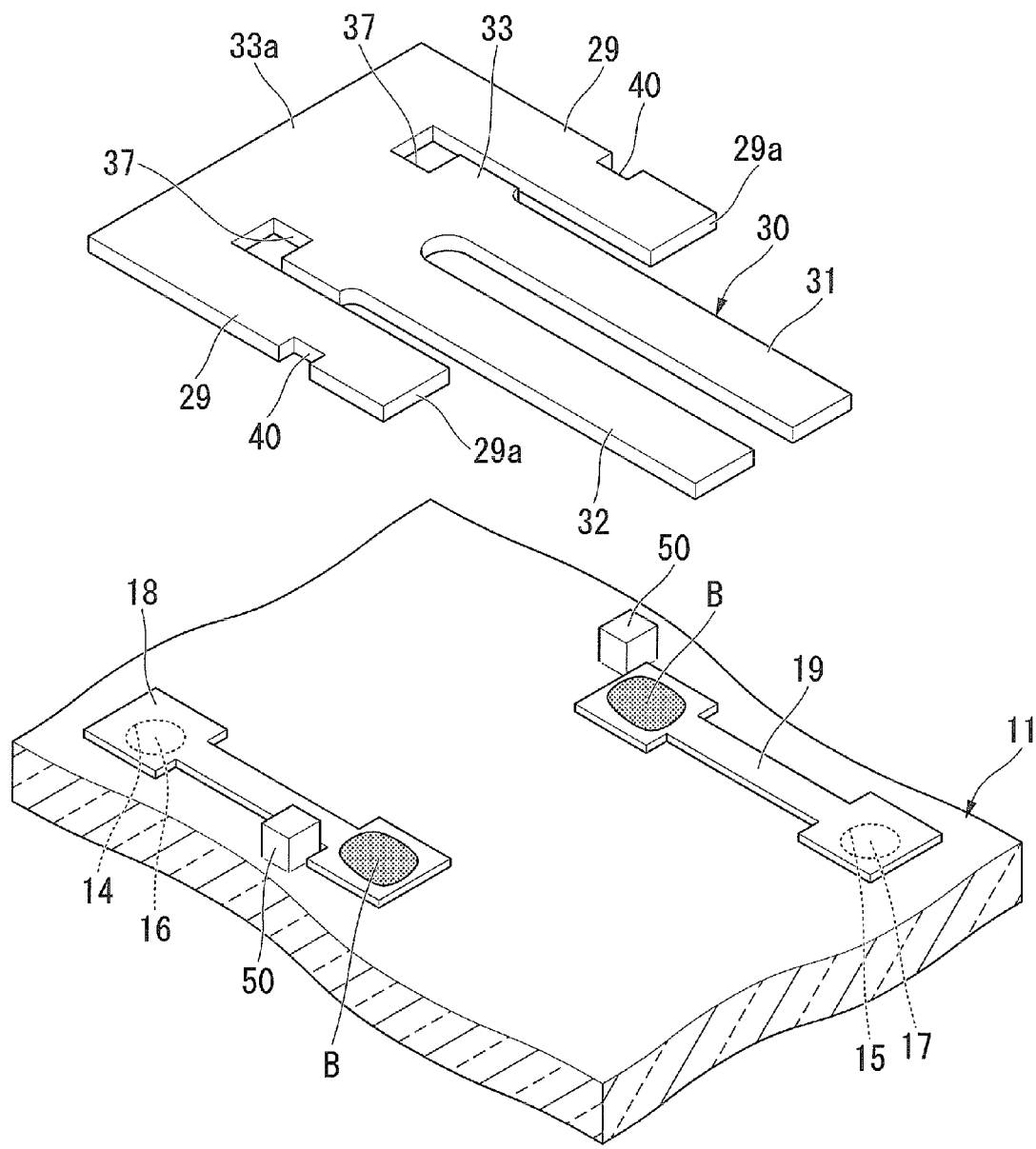
FIG. 8 is a drawing of a third modification of the piezoelectric vibrator showing an example in which the engaging depressions are formed on side arms provided on the base portion.

FIG. 8 is a drawing of a third modification of the piezoelectric vibrator reed showing an example in which engaging depressions are formed on side arms provided on the base portion.

As shown in FIG. 8, a pair of side arms 29 extending along the longitudinal direction on both sides in the width direction of the base portion 33 may be formed integrally with the base portion 33 (so called, a side arm type).

More specifically, the respective side arms 29 extend from the end portion 33a side of the base portion 33 toward the both sides in the width direction and extend from the outer side end portions toward the vibrating arm portions 31 and 32 sides along the longitudinal direction. In other words, the respective side arms 29 are positioned on both sides of the base portion 33 and the proximal end portions of the vibrating arm portions 31 and 32 in the width direction.

In this case, a mount electrode, not shown, is formed so as to be positioned at distal end portions 29a of the side arms 29. The drawing electrodes 18 and 19 are formed so that one end portions thereof are brought into conduction with the through electrodes 16 and 17 and so that the other end portions oppose the mount electrode of the distal end portions 29a of the side arms 29 and are brought into conduction with the distal end portions 29a via the bumps B.

In this configuration, the engaging depressions 40 may be formed at the distal end portions 29a of the side arms 29 and the engaging projections 50 may be formed at positions to be fitted to the engaging depressions 40. In this case as well, positioning and fixation of the piezoelectric vibration reed 30 is further ensured.

By forming the side arms 29 and 29, a long distance can be secured between the connecting portions of the vibrating arm portions 31 and 32 and the mount portions (the distal end portions 29a of the side arms 29) of the base portion 33. Consequently, the vibration leak is inhibited without increasing the entire length of the piezoelectric vibration reed 30, and the CI value is prevented from increasing, whereby the deterioration of the quality of the output signal may be inhibited.

Furthermore, in the illustrated example, the base portion 33 is formed with notched portions (notches) 37 notched from both side surfaces of the width direction respectively toward the center in the width direction.

The notched portions 37 open respectively outward in the width direction, and penetrate through the base portion 33 in the thickness direction. Therefore, the base portion 33 in this case has a constricted shape having a narrow portion narrower than other portions.

With the narrower portion formed by the notched portions 37, a route through which the vibrations excited by the vibrating arm portions 31 and 32 are transmitted toward the base portion 33 side can be narrowed, so that the vibrations are locked on the side of the vibrating arm portions 31 and 32 and are easily inhibited from leaking toward the base portion 33 side. Accordingly, the vibration leak can be inhibited effectively.

Fourth to Sixth Modifications of Embodiment

Figure 9:
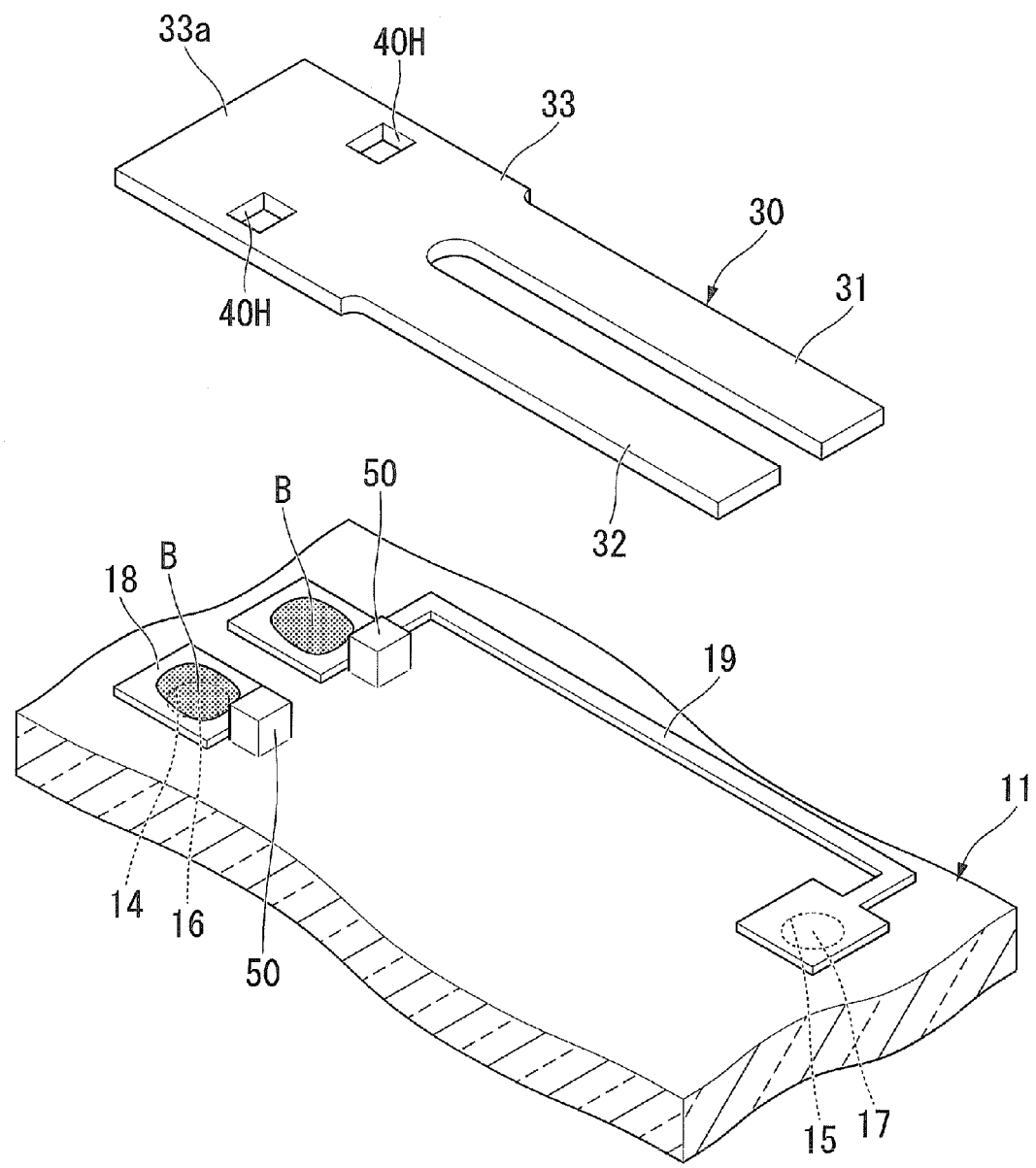
FIG. 9 is a drawing of a fourth modification of the piezoelectric vibrator showing an example in which the engaging depressions are replaced by through holes in a configuration shown in FIG. 6.

FIG. 9 is a drawing of a fourth modification of the piezoelectric vibrator showing an example in which the engaging depressions are replaced by through holes in the configuration shown in FIG. 6.

Figure 10:
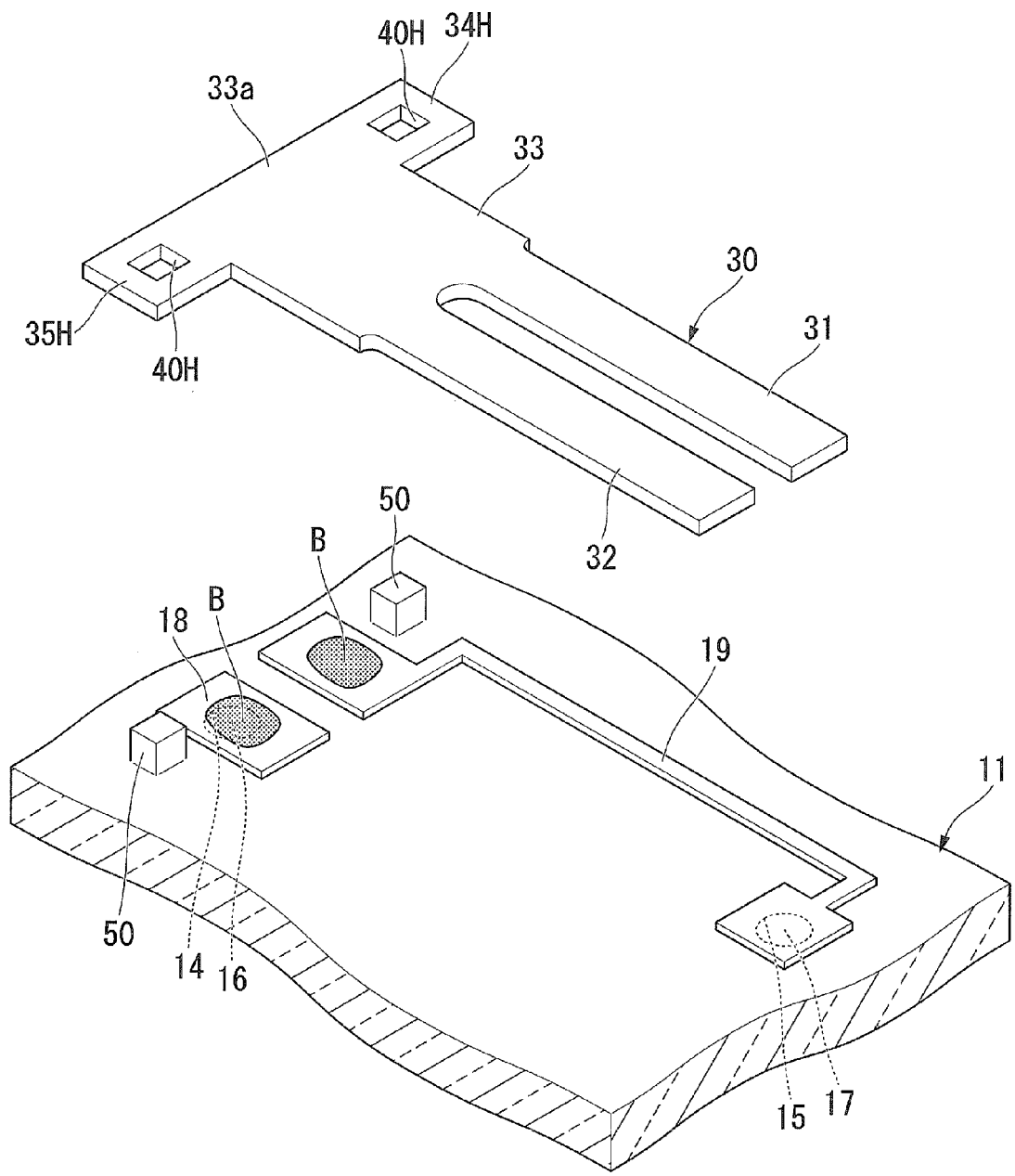
FIG. 10 is a drawing of a fifth modification of the piezoelectric vibrator showing an example in which the engaging depressions are replaced by the through holes in a configuration shown in FIG. 7.

FIG. 10 is a drawing of a fifth modification of the piezoelectric vibrator showing an example in which the engaging depressions are replaced by the through holes in the configuration shown in FIG. 7.

Figure 11:
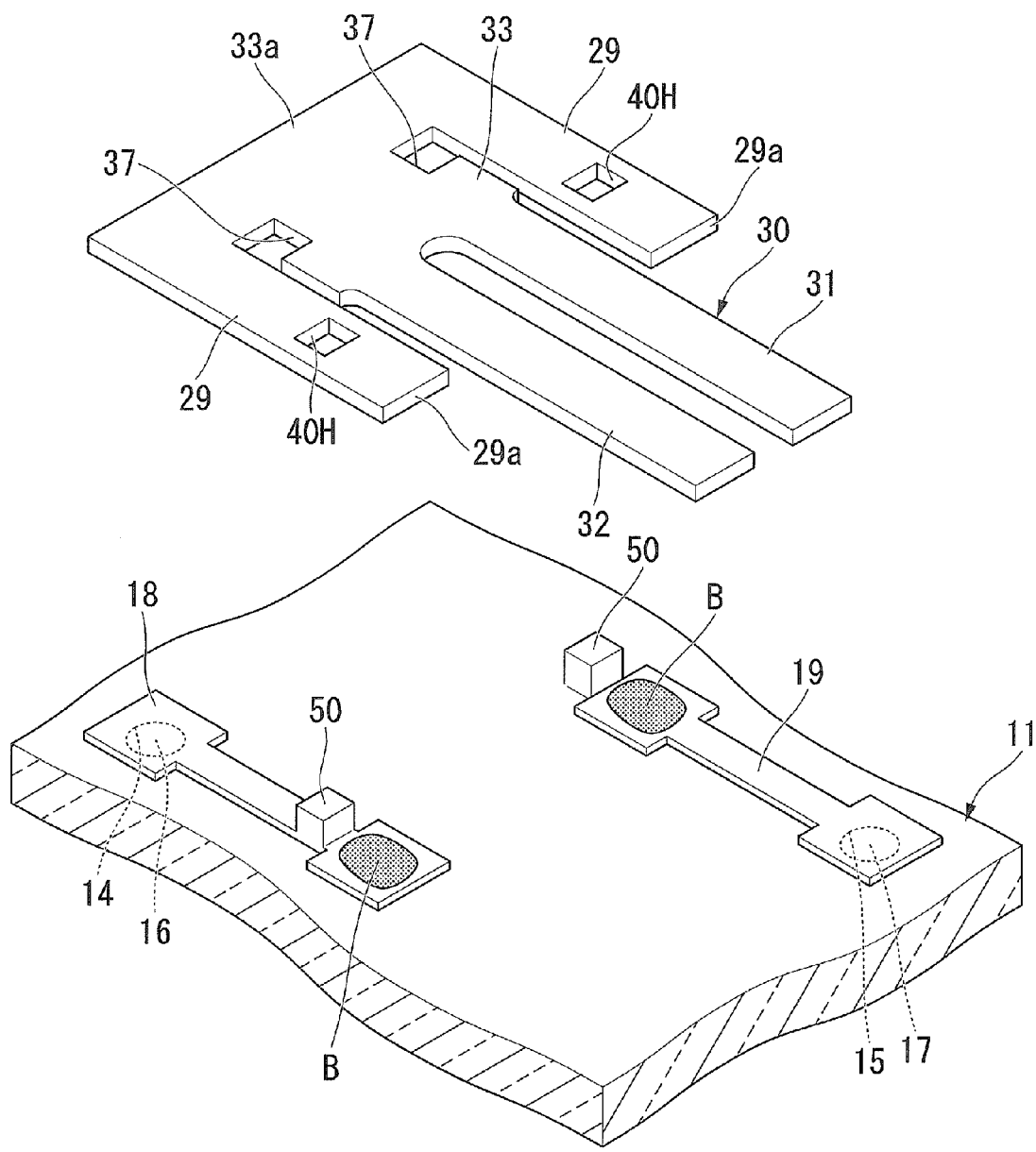
FIG. 11 is a drawing of a sixth modification of the piezoelectric vibrator showing an example in which the engaging depressions are replaced by the through holes in a configuration shown in FIG. 8.

FIG. 11 is a drawing of a sixth modification of the piezoelectric vibrator showing an example in which the engaging depressions are replaced by the through holes in the configuration shown in FIG. 8.

As illustrated in FIG. 9 to FIG. 11, a configuration in which through holes (second engaging portions) 40H are formed inside an outer peripheral potion of the base portion 33 instead of the above-described engaging depressions 40, and the engaging projections 50 are fitted into the through holes 40H is also applicable. In this configuration as well, the same effects as in the first to third modifications are achieved.

As shown in FIG. 11, the engaging projections 50 may be formed on parts of the drawing electrodes 18 and 19.

In the respective embodiments described above, the engaging depressions 40 or the engaging projections 50 may be also configured to function as electrodes. More specifically, in the case of the engaging projections 50, for example, the engaging projections 50 may be formed like metallic pins using a conductive material, or the engaging projections 50 may be replaced by a conductive film formed on a surface of each of resin-made pins. In any event, at least the surface of the engaging projections 50 is needed to be formed of the conductive material.

Then, the engaging depressions 40 are formed in a state of being in conduction with the mount electrodes formed on the base portion 33 of the piezoelectric vibration reed 30, and the engaging projections 50 are formed in a state of being in conduction with the external electrodes 20 and 21 of the base substrate 11. The engaging projections 50 may be brought into conduction with the external electrodes 20 and 21 by providing the engaging projections 50 on the drawing electrodes 18 and 19 themselves.

In this configuration, the external electrodes 20 and 21 and the mount electrodes may be brought into conduction by engaging the engaging depressions 40 and the engaging projections 50 with respect to each other. In particular, since the electric conductivity between the external electrodes 20 and 21 and the mount electrode may be more stabilized, the reliability of the operation may be improved in addition to the effects in the respective embodiments described above.

Oscillator

Subsequently, an embodiment of the oscillator according to the invention will be described with reference to FIG. 12.

Figure 12:
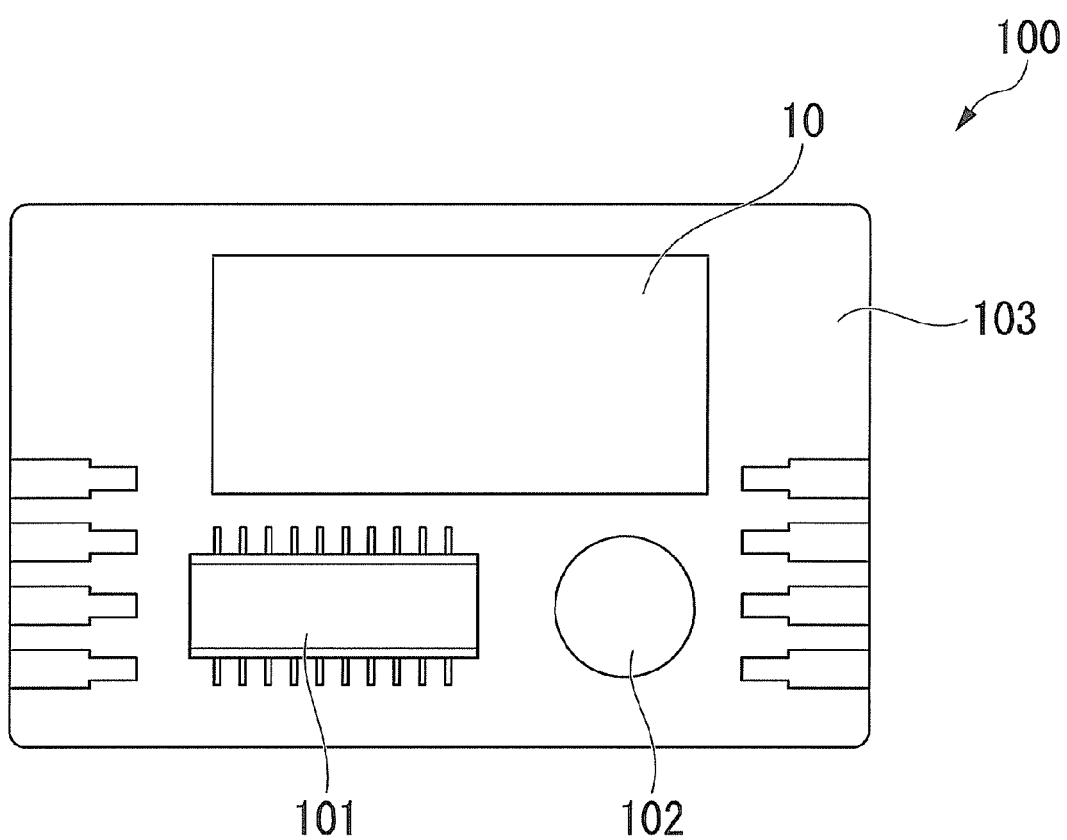
FIG. 12 is a configuration drawing showing an embodiment of an oscillator according to the invention.

An oscillator 100 in this embodiment includes the piezoelectric vibrator 10 configured as an oscillating element electrically connected to an integrated circuit 101 as shown in FIG. 12. The oscillator 100 includes a substrate 103 on which an electronic component 102 such as a capacitor is mounted. The substrate 103 includes the integrated circuit 101 described above for the oscillator mounted thereon, and the piezoelectric vibrator 10 is mounted in the vicinity of the integrated circuit 101. The electronic component 102, the integrated circuit 101, and the piezoelectric vibrator 10 are electrically connected respectively by a wiring pattern, not shown. The respective components are molded by a resin, not shown.

In the oscillator 100 configured in this manner, when a voltage is applied to the piezoelectric vibrator 10, the piezoelectric vibration reed 30 in the piezoelectric vibrator 10 vibrates. This vibration is converted into an electric signal by the piezoelectric property of the piezoelectric vibration reed 30, and is input to the integrated circuit 101 as the electric signal. The input electric signal is subjected to various processes by the integrated circuit 101 and is output as a frequency signal. Accordingly, the piezoelectric vibrator 10 functions as an oscillating element.

In addition, by selectively setting the configuration of the integrated circuit 101, for example, RTC (Real Time Clock) modules or the like according to the request, in addition to the function of a single-function oscillator for a time piece, a function to control the date and time of operation of the single-function oscillator for a time piece or external instruments or a function to provide the time of day, a calendar or the like may be added.

As described above, according to the oscillator 100 in this embodiment, since the piezoelectric vibrator 10 which demonstrates desirable vibration characteristics and improved in performance is provided, an oscillator 100 having high reliability and high performances is provided.

Electronic Instrument

Figure 13:
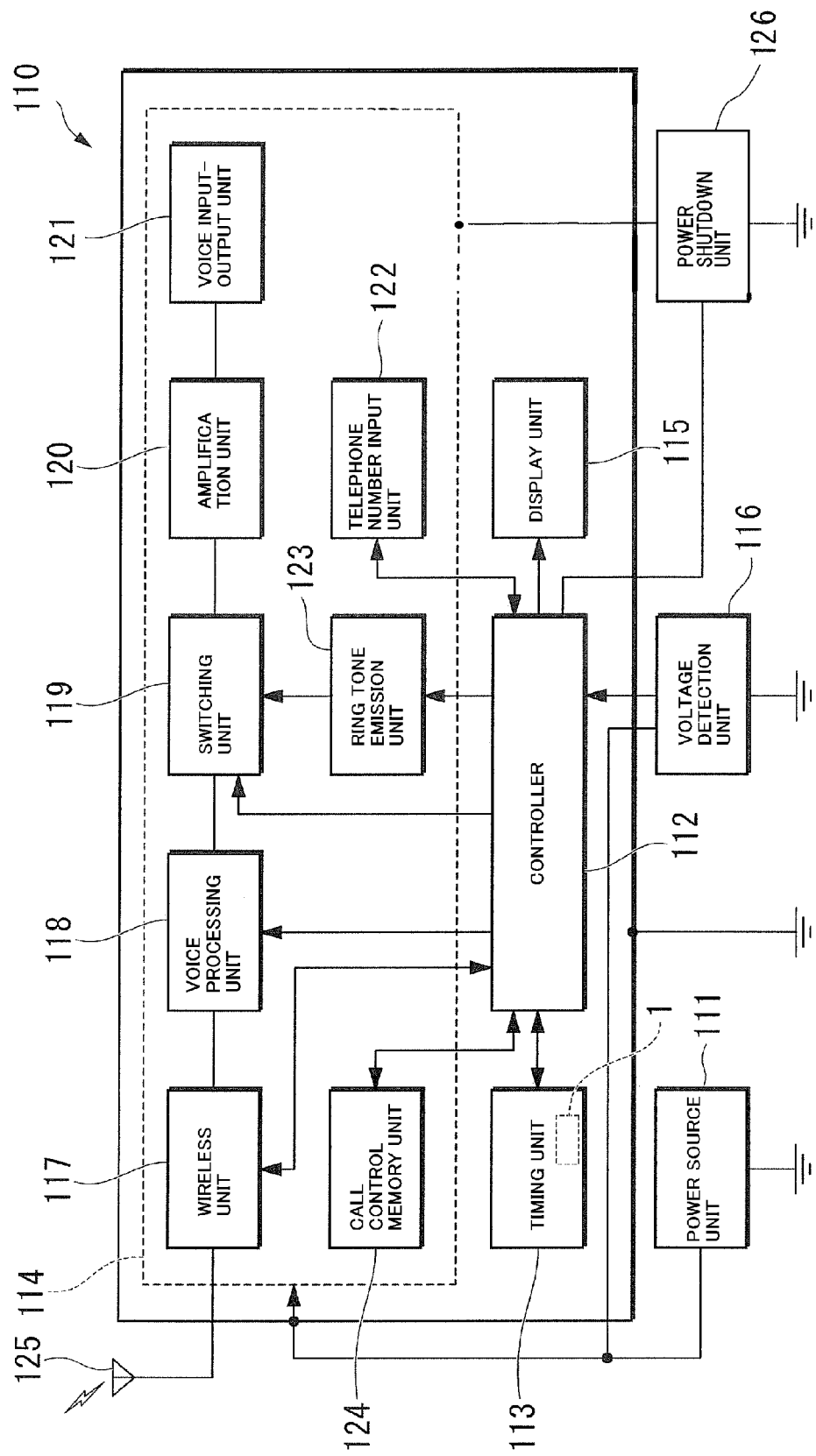
FIG. 13 is a configuration drawing showing an embodiment of an electronic instrument according to the invention.

Referring now to FIG. 13, an embodiment of the electronic instrument according to the invention will be described. A portable digital assistant device (electronic instrument) 110 having the piezoelectric vibrator 10 described above as the electronic instrument will be described as an example.

The portable digital assistant device 110 in this embodiment is represented, for example, by a mobile phone, which is a developed and improved wrist watch of the related art. An appearance is similar to the wrist watch, including a liquid crystal display at a portion corresponding to a dial, which is configured to display current time or the like on a screen thereof. When used as a communication instrument, the same communication as the mobile phones of the related art may be performed by removing the same from the wrist and using a speaker and a microphone integrated in a portion inside a band. However, downsizing and reduction in weight are dramatically achieved in comparison with the mobile phones of the related art.

Subsequently, a configuration of the portable digital assistant device 110 of this embodiment will be described. The portable digital assistant device 110 includes the piezoelectric vibrator 10 and a power source unit 111 configured to supply power as shown in FIG. 13. The power source unit 111 is formed of, for example, a lithium secondary cell. The power source unit 111 includes a control unit 112 configured to perform various types of control, a clocking unit 113 configured to count time of day or the like, a communication unit 114 configured to perform communication with the outside, a display unit 115 configured to display various items of information, and a voltage detection unit 116 configured to detect the voltage of the respective functional portions are connected in parallel to each other. Then, the power is supplied to the respective functional portions by the power source unit 111.

The control unit 112 performs sending and receiving of voice data, counting and display of the current time of day, and control of the operation of the entire system by controlling the respective functional portions. The control unit 112 includes an ROM in which a program is written in advance, a CPU configured to read out and execute the program written in the ROM, and an RAM used as a work area for the CPU.

The clocking unit 113 includes an integrated circuit having an oscillation circuit, a register circuit, a counter circuit, an interface circuit and the like integrated therein, and the piezoelectric vibrator 10. When a voltage is applied to the piezoelectric vibrator 10, the piezoelectric vibration reed 30 vibrates, and the vibration thereof is converted into an electric signal by the piezoelectric property of crystal, and is input to the oscillation circuit as the electric signal. The output of the oscillation circuit is binarized and is counted by the register circuit and the counter circuit. Then, sending and receiving of the signal with respect to the control unit 112 is performed via the interface circuit, and the current time of day, the current date, calendar information and the like are displayed on the display unit 115.

The communication unit 114 has the same function as the mobile phones of the related art, and includes a wireless unit 117, a voice processing unit 118, a switch unit 119, an amplifying unit 120, a voice input/output unit 121, a phone number input unit 122, a ring tone generating unit 123, and a call control memory unit 124.

The wireless unit 117 performs sending and receiving of various types of data such as voice data with respect to a base station via an antenna 125. The voice processing unit 118 codes and decodes the voice signal input from the wireless unit 117 or the amplifying unit 120. The amplifying unit 120 amplifies the signal input from the voice processing unit 118 or the voice input/output unit 121 to a predetermined level. The voice input/output unit 121 is formed of a speaker, a microphone, or the like, and is configured to amplify a ring tone or a receiving voice, or to collect a voice.

The ring tone generating unit 123 generates the ring tone according to a call from the base station. The switch unit 119 switches the amplifying unit 120 connected to the voice processing unit 118 to the ring tone generating unit 123 only at the time of incoming call, so that the ring tone generated by the ring tone generating unit 123 is output to the voice input/output unit 121 via the amplifying unit 120.

The call control memory unit 124 stores a program relating to control of incoming and outgoing call of communication. The phone number input unit 122 includes, for example, numerical keys from 0 to 9 and other keys, and is configured to input a telephone number of the called party or the like by pushing these numerical keys or the like.

The voltage detection unit 116 detects voltage drop when the voltage applied to the receptive functional portions such as the control unit 112 by the power source unit 111 becomes less than a predetermined value, and notifies the same to the control unit 112. The predetermined voltage value at this time is a value preset as a minimum required voltage for keeping a stable operation of the communication unit 114 and, for example, on the order of 3V. The control unit 112 which receives the notification of the voltage drop from the voltage detection unit 116 prohibits the wireless unit 117, the voice processing unit 118, the switch unit 119, and the ring tone generating unit 123 from operating. In particular, the stop of the operation of the wireless unit 117 which consumes a large amount of power is essential. Then, the effect that the communication unit 114 is disabled due to insufficient remaining battery power is displayed on the display unit 115.

In other words, the operation of the communication unit 114 is prohibited by the voltage detection unit 116 and the control unit 112, and that effect may be displayed on the display unit 115. This display may be a literal message. However, as more intuitive display, a cross mark (x) may be shown on a phone icon displayed on an upper portion of a display surface of the display unit 115.

With the provision of a power source blocking unit 126 which is capable of selectively blocking the electric power of a portion relating to the function of the communication unit 114, the function of the communication unit 114 may be stopped further reliably.

As described above, according to the portable digital assistant device 110 in this embodiment, since the piezoelectric vibrator 10 demonstrating desirable vibration characteristics and having an advanced performance is provided, the portable digital assistant device 110 having high reliability and high performance can be provided.

Radio Timepiece

Figure 14:
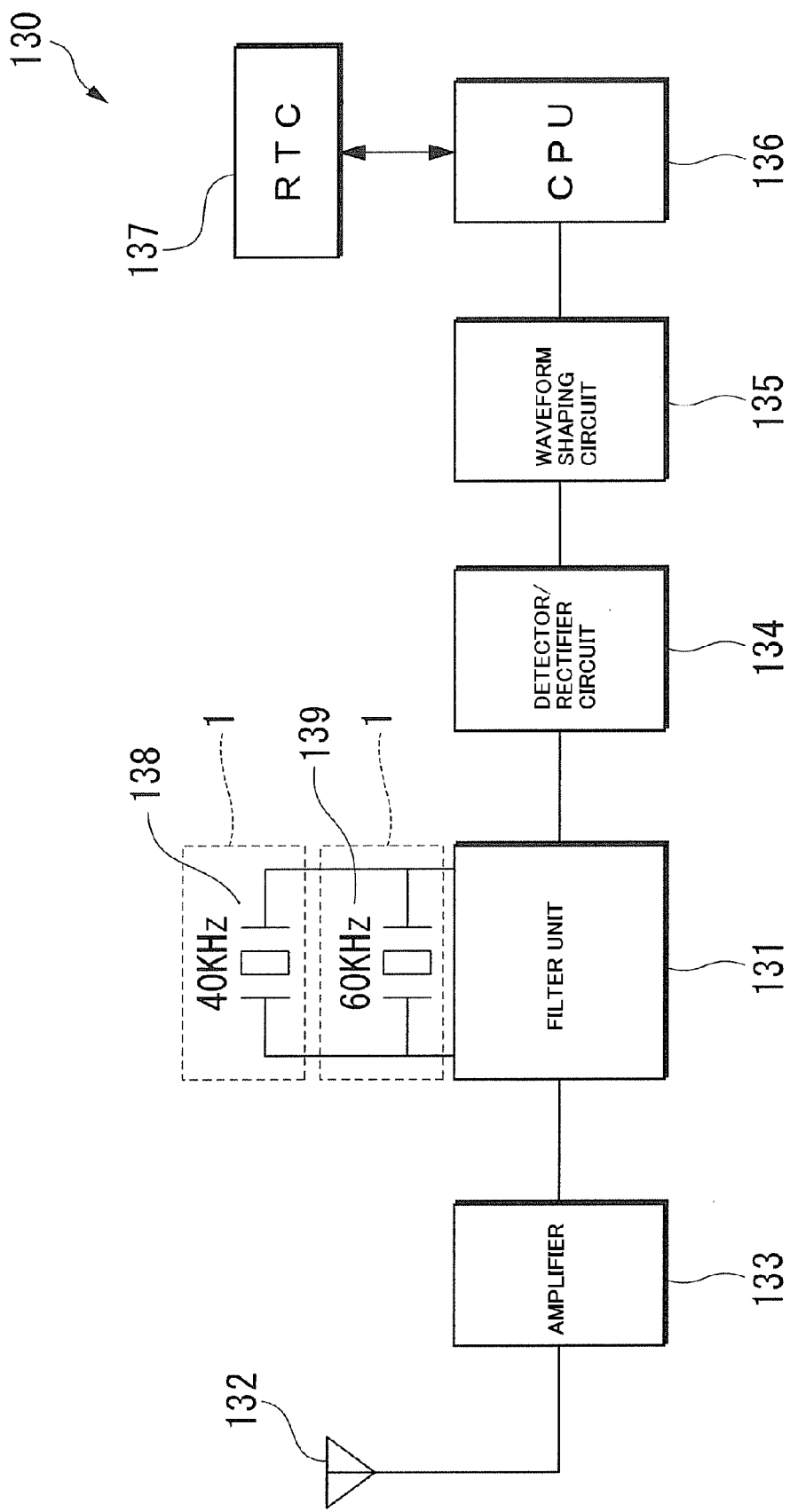
FIG. 14 is a configuration drawing showing an embodiment of a radio timepiece according to the invention.
Figure 15:
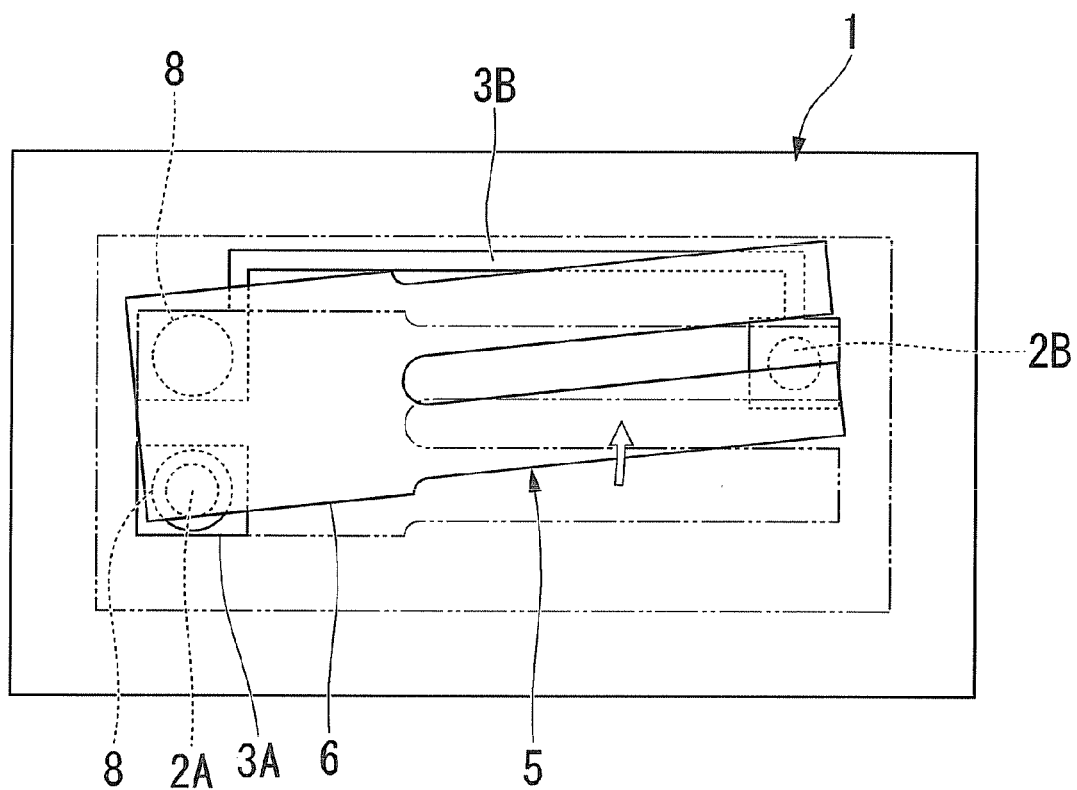
FIG. 15 is a drawing showing a related art in which a positional displacement of a piezoelectric vibration reed is occurred.

Referring now to FIG. 14, an embodiment of a radio timepiece according to the invention will be described.

A radio timepiece 130 in this embodiment includes the piezoelectric vibrator 10 electrically connected to a filter 131 as shown in FIG. 14, and is a timepiece having a function to receive standard radio waves including timepiece information and display an accurate time-of-day automatically corrected.

In Japan, there are two transmitting stations (transmitter stations) which transmit standard radio waves in Fukushima prefecture (40 kHz) and Saga prefecture (60 kHz), and transmit respective standard radio waves. Since long waves such as 40 kHz or 60 kHz have both a property to propagate the ground surface and a property to propagate while being reverberate between an ionization layer and the ground surface, a wide range of the propagation is achieved, so that the above-described two transmitting stations cover entire part of Japan.

Hereinafter, a functional configuration of the radio timepiece 130 will be described in detail.

An antenna 132 receives a long standard radio wave of 40 kHz or 60 kHz. The long standard radio wave is time information referred to as time code subjected to an AM modulation to a carrier wave of 40 kHz or 60 kHz. The received long standard radio wave is amplified by an amplifier 133 and is filtered and synchronized by the filter 131 having a plurality of the piezoelectric vibrators 10.

The piezoelectric vibrators 10 in this embodiment include quartz vibrator units 138 and 139 having resonant frequencies of 40 kHz and 60 kHz which are the same as the above-described carrier frequencies, respectively.

In addition, a signal filtered and having a predetermined frequency is subjected to detection and demodulation by a detection and rectification circuit 134.

Subsequently, the time code is acquired via a waveform shaping circuit 135, and is counted by a CPU 136. The CPU 136 reads information such as the current year, day of year, day of the week, time of day, and the like. The read information is reflected on an RTC 137, and a correct time of day information is displayed.

Since the carrier wave has 40 kHz or 60 kHz, vibrators having the above-described tuning-fork type structure are suitable for the quartz vibrator units 138 and 139.

The above-described description is based on an example in Japan, and the frequencies of the long standard radio waves are different in foreign countries. For example, in Germany, a standard radio wave of 77.5 kHz is used. Therefore, when integrating the radio timepiece 130 which is compatible also in foreign countries in mobile apparatuses, another piezoelectric vibrator 10 having a frequency different from that in Japan is required.

As described above, according to the radio timepiece 130 in this embodiment, since the piezoelectric vibrator 10 demonstrating desirable vibrating characteristics and having advanced performance is provided, the radio timepiece 130 having the high reliability and the high performance can be provided.

Although the embodiments of the invention have been described in detail referring to the drawings, detailed configurations are not limited to these embodiments, and modifications in design and the like without departing the scope of the invention are also included.

For example, a configuration of the embodiment described above is that the base portion 33 of the piezoelectric vibration reed 30 and the drawing electrodes 18 and 19 on the side of the base substrate 11 are fixed by the bumps B. However, a configuration in which the base portion 33 of the piezoelectric vibration reed 30 and the drawing electrodes 18 and 19 on the side of the base substrate 11 are fixed by a conductive adhesive agent instead of the bumps B is also applicable.

The arrangement of the engaging depressions 40 and the engaging projections 50, the number of the engaging depressions 40 and the engaging projections 50 to be arranged, the shapes and the like are not limited to those described above, and may be set arbitrarily.

In addition, in the embodiment described above, the engaging depression 40 is formed on the piezoelectric vibration reed 30 and the engaging projection 50 is provided on the base substrate 11. However, a configuration in which the engaging projection 50 is provided on the piezoelectric vibration reed 30 and the engaging depression 40 is formed on the upper surface of the base substrate 11 is also applicable.

In addition, the configurations described above may be sorted out or may be changed to other configurations as needed without departing the scope of the invention.

What is claimed is:

1. A piezoelectric vibrator, comprising:
    a base substrate;
    a piezoelectric vibration reed mounted on the base substrate, the piezoelectric vibration reed comprising:
        a pair of vibrating arm portions arranged in parallel to each other; and
        a base portion configured to integrally fix proximal end sides in the longitudinal direction of the pair of vibrating arm portions; and
    a lid substrate opposing the base substrate and configured to accommodate the piezoelectric vibration reed in a cavity defined between the lid substrate and the base substrate,
    wherein the base substrate comprises a first engaging portion, and the base portion of the piezoelectric vibration reed comprises a second engaging portion configured to engage the first engaging portion and guide the piezoelectric vibration reed to a predetermined mount position on the base substrate.

2. The piezoelectric vibrator of claim 1, wherein first engaging portion comprises a projecting portion projecting from a surface of the base substrate, and the second engaging portion is defined by a depression or a through hole formed on the base portion of the piezoelectric vibration reed.

3. The piezoelectric vibrator of claim 2, wherein the second engaging portion receives the first engaging portion.

4. The piezoelectric vibrator of claim 1, wherein the base substrate comprises a set of first engaging portions and the base portion of the piezoelectric vibration reed comprises a set of second engaging portions.

5. The piezoelectric vibrator of claim 4, wherein the each of the first engaging portions comprises a projecting portion projecting from a surface of the base substrate, and wherein each of the second engaging portions is defined by a depression or through hole formed on the base portion of the piezoelectric vibration reed.

6. The piezoelectric vibrator of claim 5, wherein each of the second engaging portions receives one of the first engaging portions.

7. The piezoelectric vibrator of claim 1, wherein:

the first engaging portion is electrically connected to an external electrode formed on the base substrate for distributing electricity to the piezoelectric vibration reed, the second engaging portion is electrically connected to a mount electrode formed on the base substrate of the piezoelectric vibration reed, and the external electrode and the mount electrode are electrically connected to each other by the engagement between the first engaging portion and the second engaging portion.

8. A piezoelectric vibrator, comprising:

a base substrate comprising a first engaging portion;

a lid substrate above the base substrate;

a cavity defined between the base substrate and the lid substrate; and a piezoelectric vibration reed mounted on the base substrate and within the cavity, the piezoelectric vibration reed comprising:
- a base portion comprising a second engaging portion engaged with the first engaging portion; and
- a pair of vibrating arm portions integrally connected with the base portion and extending from the base portion in parallel to each other, wherein first engaging portion comprises a projecting portion projecting from a surface of the base substrate, and the second engaging portion is defined by a depression or a through hole formed on the base portion of the piezoelectric vibration reed.

9. The piezoelectric vibrator of claim 8, wherein the second engaging portion receives the first engaging portion.

10. The piezoelectric vibrator of claim 8, wherein the base substrate comprises a set of first engaging portions and the base portion of the piezoelectric vibration reed comprises a set of second engaging portions.

11. The piezoelectric vibrator of claim 10, wherein the each of the first engaging portions comprises a projecting portion projecting from a surface of the base substrate, and wherein each of the second engaging portions is defined by a depression or through hole formed on the base portion of the piezoelectric vibration reed.

12. The piezoelectric vibrator of claim 11, wherein each of the second engaging portions receives one of the first engaging portions.

13. The piezoelectric vibrator of claim 8, wherein:

the first engaging portion is electrically connected to an external electrode formed on the base substrate for distributing electricity to the piezoelectric vibration reed, the second engaging portion is electrically connected to a mount electrode formed on the base substrate of the piezoelectric vibration reed, and the external electrode and the mount electrode are electrically connected to each other by the engagement between the first engaging portion and the second engaging portion.

14. A piezoelectric vibrator, comprising:

a base substrate comprising an engaging projection projecting up from an upper surface of the base substrate;

a lid substrate above the base substrate;

a cavity defined between the base substrate and the lid substrate; and a piezoelectric vibration reed mounted on the base substrate and within the cavity, the piezoelectric vibration reed comprising:
- a base portion comprising an engaging depression defined in the base portion, wherein the engaging projection is at least partially inserted into the engaging depression; and
- a pair of vibrating arm portions integrally connected with the base portion and extending from the base portion in parallel to each other.

15. The piezoelectric vibrator of claim 14, wherein:

the base substrate comprises a set of engaging projections, each projecting up from the upper surface of the base substrate, and the base portion of the piezoelectric vibration reed comprises a set of engaging depressions, each defined in the base portion.

16. The piezoelectric vibrator of claim 15, wherein each of the engaging depressions receives one of the engaging projections.

17. The piezoelectric vibrator of claim 14, wherein:

the engaging projection is electrically connected to an external electrode formed on the base substrate for distributing electricity to the piezoelectric vibration reed, the engaging depression is electrically connected to a mount electrode formed on the base substrate of the piezoelectric vibration reed, and the external electrode and the mount electrode are electrically connected to each other by the engagement between the engaging projection and the engaging depression.

* * * * *